United States Patent
Chaudhri et al.

(10) Patent No.: US 12,249,843 B2
(45) Date of Patent: Mar. 11, 2025

(54) PORTABLE BATTERY PACK FOR WIRELESSLY CHARGING BODY-WORN DEVICES THROUGH CLOTHING

(71) Applicant: Humane, Inc., San Francisco, CA (US)

(72) Inventors: Imran A. Chaudhri, San Francisco, CA (US); James Joseph Blanc, San Mateo, CA (US); Brian Huppi, San Francisco, CA (US)

(73) Assignee: Humane, Inc., San Francisco, CA (US)

( * ) Notice: Subject to any disclaimer, the term of this patent is extended or adjusted under 35 U.S.C. 154(b) by 99 days.

(21) Appl. No.: 16/904,545

(22) Filed: Jun. 17, 2020

(65) Prior Publication Data

US 2021/0111591 A1 Apr. 15, 2021

Related U.S. Application Data

(60) Provisional application No. 62/863,216, filed on Jun. 18, 2019.

(51) Int. Cl.
| | |
|---|---|
| *H02J 7/00* | (2006.01) |
| *H01F 38/14* | (2006.01) |
| *H02J 7/02* | (2016.01) |
| *H02J 50/12* | (2016.01) |
| *G03B 17/56* | (2021.01) |
| *H03F 3/217* | (2006.01) |

(52) U.S. Cl.
CPC .............. *H02J 50/12* (2016.02); *H01F 38/14* (2013.01); *H02J 7/0045* (2013.01); *H02J 7/02* (2013.01); *G03B 17/561* (2013.01); *H02J 2207/20* (2020.01); *H03F 3/2176* (2013.01)

(58) Field of Classification Search
USPC ................. 320/106, 107, 108, 109, 110, 152
See application file for complete search history.

(56) References Cited

U.S. PATENT DOCUMENTS

| | | | | |
|---|---|---|---|---|
| 5,703,470 | A * | 12/1997 | Baranowski | H01M 10/46 320/152 |
| 8,890,369 | B2 * | 11/2014 | Baarman | H02J 50/40 320/108 |
| 9,601,943 | B2 | 3/2017 | Partovi et al. | |
| 9,780,583 | B2 | 10/2017 | Furui et al. | |
| 11,722,013 | B1 | 8/2023 | Chaudhri et al. | |

(Continued)

FOREIGN PATENT DOCUMENTS

| | | | | |
|---|---|---|---|---|
| AU | 2015101232 | A4 * | 10/2015 | ......... H01M 10/425 |
| CA | 2986217 | | 12/2016 | |

(Continued)

OTHER PUBLICATIONS

International Preliminary Report on Patentability in International Appln. No. PCT/US2020/038207, dated Dec. 30, 2021, 13 pages.

(Continued)

*Primary Examiner* — Brian Ngo

(74) *Attorney, Agent, or Firm* — Fish & Richardson P.C.

(57) ABSTRACT

A portable battery pack is disclosed for wirelessly powering a portable electronic device through a user's clothing. The portable battery pack includes a housing with a mating surface that includes one or more permanent magnets to facilitate mating with a portable electronic device, such as a body-worn camera.

6 Claims, 6 Drawing Sheets

(56) References Cited

U.S. PATENT DOCUMENTS

| | | | |
|---|---|---|---|
| 2010/0001691 A1 | 1/2010 | Li | |
| 2010/0225429 A1* | 9/2010 | Tsai | H01F 7/0247 335/219 |
| 2012/0032632 A1 | 2/2012 | Soar | |
| 2012/0150259 A1 | 6/2012 | Meskens | |
| 2013/0162195 A1* | 6/2013 | Zhu | H02J 7/345 320/107 |
| 2013/0249479 A1* | 9/2013 | Partovi | H02J 50/50 320/108 |
| 2013/0285618 A1* | 10/2013 | Iijima | H02J 5/005 307/104 |
| 2014/0132206 A1 | 5/2014 | Zhu | |
| 2014/0358297 A1 | 12/2014 | Fadell et al. | |
| 2016/0039305 A1 | 2/2016 | Yamamoto et al. | |
| 2016/0056639 A1* | 2/2016 | Mao | H02J 50/12 307/104 |
| 2016/0261134 A1 | 9/2016 | Wu et al. | |
| 2017/0093167 A1 | 3/2017 | Von Novak, III et al. | |
| 2018/0083474 A1 | 3/2018 | Rajamaki | |
| 2018/0289189 A1 | 10/2018 | Lazzi et al. | |
| 2018/0332211 A1 | 11/2018 | Chaudhri et al. | |
| 2020/0227946 A1* | 7/2020 | Mao | H02J 50/12 |
| 2023/0327497 A1 | 10/2023 | Chaudhri et al. | |

FOREIGN PATENT DOCUMENTS

| | | | | |
|---|---|---|---|---|
| CN | 103703652 | | 4/2014 | |
| CN | 101919139 B | * | 8/2014 | H01F 38/14 |
| CN | 104467129 | | 3/2015 | |
| CN | 105490358 | | 4/2016 | |
| JP | 2011-08745 | | 4/2011 | |
| JP | 2014-007924 | | 1/2014 | |
| JP | 2014-023298 | | 2/2014 | |
| JP | 2015-011971 | | 1/2015 | |
| JP | 2015-061468 | | 3/2015 | |
| JP | 2017038797 | | 6/2018 | |
| JP | 2018-527864 | | 9/2018 | |
| KR | 20170016147 A | * | 2/2017 | |
| KR | 20210022496 A | * | 3/2021 | |
| OA | 18521 A | * | 12/2018 | |
| WO | WO 2017/038797 | | 3/2017 | |
| WO | WO 2018/103021 | | 6/2018 | |

OTHER PUBLICATIONS

PCT International Search Report and Written Opinion in International Appln. No. PCT/US2020/038207, dated Sep. 9, 2020, 14 pages.

Extended European Search Report in European Appln No. 20827147.8, dated Jun. 23, 2023, 9 pages.

Jiang et al., "Pulse: low bitrate wireless magnetic communication for smartphones," UbiComp '14: Proceedings of the 2014 ACM International Joint Conference on Pervasive and Ubiquitous Computing, Sep. 2014, pp. 261-265.

EETimes.com [online], "Haptics technology: picking up good vibrations," Jul. 2011, retrieved on Jun. 2024, retrieved from URL<https://www.eetimes.com/haptics-technology-picking-up-good-vibrations/?_ga>, 5 pages.

* cited by examiner

PORTABLE BATTERY PACK FOR WIRELESSLY CHARGING BODY-WORN DEVICES THROUGH CLOTHING

CROSS-RELATED APPLICATIONS

This application claims the benefit of priority from U.S. Provisional Patent Application No. 62/863,216, for "Portable Battery Pack for Wirelessly Charging Body-Worn Devices Through Clothing," filed Jun. 18, 2019, which provisional patent application is incorporated by reference herein in its entirety.

TECHNICAL FIELD

This disclosure relates generally to portable battery packs for portable electronic devices.

BACKGROUND

Rechargeable battery packs are commercially available today to deliver extended runtimes to mobile devices, such as smart phones and tablet computers. An advantage of a battery pack is that it can be easily swapped into or out of a mobile device. The battery packs are recharged using a standard electrical outlet. A conventional battery pack includes battery cells and circuitry for delivering charge to the mobile device and for recharging the battery pack using a standard wall outlet. Conventional battery packs rely on a metal contacts between positive/negative power terminals on the battery pack and corresponding positive/negative power terminals on the mobile device. Although conventional battery packs mate well with mobile phones and tablet computers placed on a surface, conventional battery packs are not convenient to use with wearable devices, such as a body-worn cameras.

SUMMARY

A portable battery pack is disclosed for wirelessly powering a portable electronic device through a user's clothing.

In an embodiment, a portable battery pack comprises: battery cells; a power amplifier coupled to the battery cells; a rectifier and battery charger coupled to the battery cells; a connector with metal contacts coupled to the rectifier and battery charger for connecting to an input power source; and a transmitter coil coupled to the power amplifier through transmitter resonant capacitors.

In an embodiment, a portable battery pack comprises: battery cells; a power amplifier coupled to the battery cells; a rectifier and battery charger coupled to the battery cells; a receiver coil coupled to the rectifier and battery charger through receiver resonant capacitors; and a transmitter coil coupled to the power amplifier through transmitter resonant capacitors.

In an embodiment, a portable battery pack comprises: a coil; battery cells; a power amplifier coupled to the battery cells; a rectifier and battery charger coupled to the battery cells; and a switching means configured to couple the coil to the rectifier and battery charger and disconnect the coil from the power amplifier during a charging mode of operation, and to connect the coil to the power amplifier and disconnect the coil from the rectifier and battery charger during a power transfer mode of operation. In an embodiment, the power amplifier is a single-ended Class-E or Class-D power amplifier. In an embodiment, the coils are constructed using spiral wound traces (e.g., copper traces) on a printed circuit board (PCB), and a shield of ferrite material is used behind the PCB to shape the magnetic field.

In an embodiment, a portable battery pack comprises: a housing having a mating surface; one or more permanent magnets disposed on the mating surface for coupling with one or more permanent magnets on a portable electronic device; battery cells secured within the housing; a printed circuit board (PCB) secured within the housing, the PCB including: a power amplifier coupled to the battery cells; a rectifier and battery charger coupled to the battery cells; a connector with metal contacts coupled to the rectifier and battery charger for connecting to an input power source; and a transmitter coil coupled to the power amplifier through transmitter resonant capacitors.

In an embodiment, a portable battery pack comprises: a housing having a mating surface; one or more permanent magnets disposed on the mating surface for coupling with one or more permanent magnets on a portable electronic device; battery cells secured within the housing; a printed circuit board (PCB) secured within the housing, the PCB including: a power amplifier coupled to the battery cells; a rectifier and battery charger coupled to the battery cells; a receiver coil coupled to the rectifier and battery charger through receiver resonant capacitors; and a transmitter coil coupled to the power amplifier through transmitter resonant capacitors.

In an embodiment, a portable battery pack comprises: a housing having a mating surface; one or more permanent magnets disposed on the mating surface for coupling with one or more permanent magnets on a portable electronic device; battery cells secured within the housing; a printed circuit board (PCB) secured within the housing, the PCB including: a power amplifier coupled to the battery cells; a rectifier and battery charger coupled to the battery cells; and a switching means configured to couple the coil to the rectifier and battery charger and disconnect the coil from the power amplifier during a charging mode of operation, and to connect the coil to the power amplifier and disconnect the coil from the rectifier and battery charger during a power transfer mode of operation.

In an embodiment, a wireless power transfer system comprises: a portable battery pack including: a first housing having a first mating surface; a first permanent magnet disposed on the first mating surface for coupling with a second permanent magnet on a portable electronic device; first battery cells secured within the first housing; a first printed circuit board (PCB) secured within the first housing, the first PCB including: a power amplifier coupled to the first battery cells; a rectifier and battery charger coupled to the first battery cells; a connector with metal contacts coupled to the rectifier and battery charger for connecting to an input power source; and a transmitter coil coupled to the power amplifier through transmitter resonant capacitors.

The wireless power transfer system further comprises: a portable electronic device including: a second housing having a second mating surface; the permanent magnet disposed on the second mating surface for coupling with the first permanent magnet disposed on the first mating surface of the portable battery pack; a second battery included in the second housing; a receiver coil included in the second housing and coupled to the second battery; a second PCB included in the second housing; and a camera attached to the second PCB.

Particular embodiments disclosed herein provide one or more of the following advantages. The disclosed portable battery pack uses resonant inductive charging to wirelessly power a portable electronic device through a user's clothing without using any cumbersome power cords. The portable device mates with the portable electronic device using one or more permanent magnets, resulting in a single device rather than two separate devices. The portable battery pack is easily swapped out with another portable battery pack without having to disconnect wires. In an embodiment, the portable battery pack includes a receiver coil to allow the portable battery pack to be wireless charged (e.g., using a charge mat), and also an electrical connector to allow the portable battery pack to be charged using a standard AC wall outlet or transformer ("wall wart"). In an embodiment, a single coil is connected to a switch to allow the coil to be used as a receive coil or a transmit coil depending on whether the portable power pack is operating in a power transfer mode or a charging mode.

The details of the disclosed embodiments are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

Figure 1:
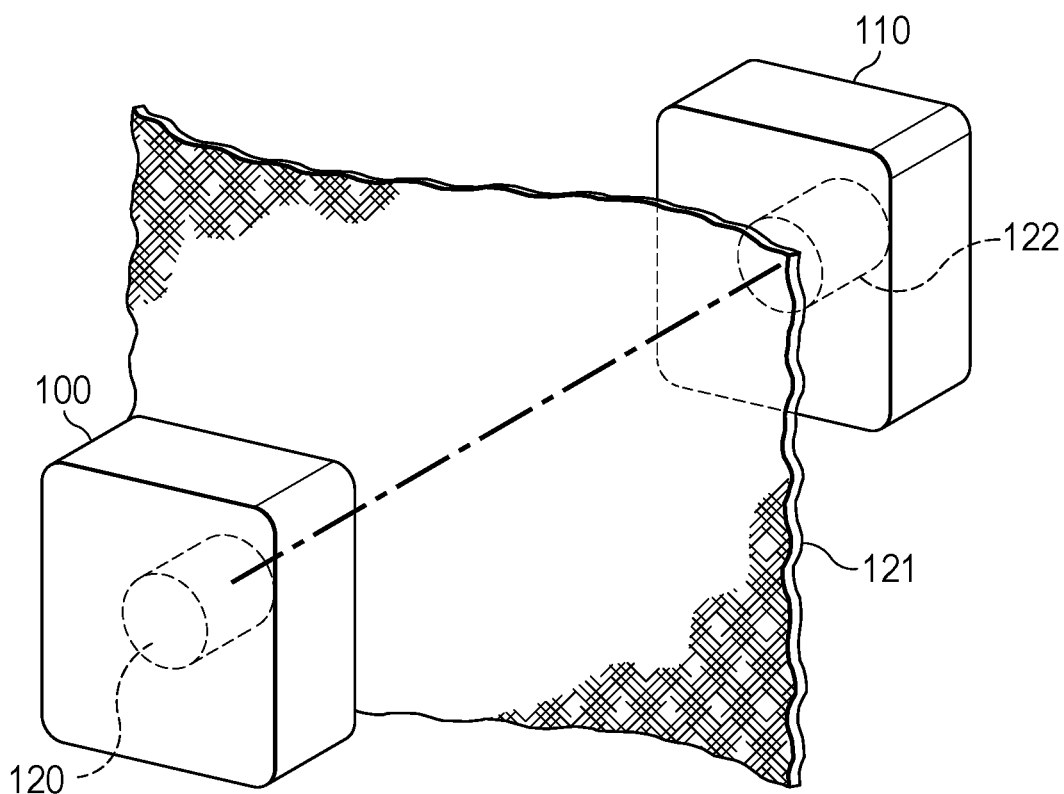
FIG. 1 is a perspective view of a portable battery pack wirelessly powering a portable electronic device through a user's clothing, according to an embodiment.

FIG. 1 is a perspective view of portable battery pack 100 wirelessly powering portable electronic device 110 through user's clothing 121, according to an embodiment. Portable electronic device 110 can be any electronic device or circuit, such as the wearable multimedia device described in U.S. Patent Publication No. 20180332211A1.

In the example shown, battery pack 100 includes a mating surface that has permanent magnet 120 (e.g., N pole) disposed thereon, and portable electronic device 110 has a corresponding mating surface that has permanent magnet 122 (e.g., S pole) disposed thereon. Although two permanent magnets 120, 122 are shown in FIG. 1, any number of permanent magnets having any desired shape or size can be arranged in any desired pattern on the mating surfaces.

Permanent magnets 120, 122 hold portable battery pack 100 and portable electronic device 110 together in a mated configuration with clothing 121 therebetween. In an embodiment, portable battery pack 100 and electronic device 110 have the same mating surface dimensions, such that there is no overhanging portions when in a mated configuration. A user magnetically fastens portable electronic device 110 to their clothing 121 by placing portable battery pack 100 underneath their clothing 121 and placing portable electronic device 110 on top of portable battery pack 100 outside their clothing 121, such that permanent magnets 120, 122 attract each other through clothing 121. In an embodiment, the mating surfaces can include one or more guide structures for facilitating a desired alignment of portable electronic device 110 and portable battery pack 100 when in a mated configuration. Although the housings are shown as square-shaped, the housings can have any desired shape.

In an embodiment, portable battery pack 100 and/portable electronic device include one or more illumination devices (e.g., LEDS) to provide visual feedback regarding the operational state of portable battery pack 100. For example, an LED of portable battery pack 100 can indicate remaining power or a charging state. In an embodiment, portable battery pack 100 includes a haptic engine (e.g., a linear actuator) that provides haptic feedback indicating successful mating with portable electronic device 110 or when portable battery pack 100 is connected to a power supply. In an embodiment, portable battery pack 100 includes multiple ports (e.g., multiple USB ports) for charging portable battery pack 100 by another device (e.g., a personal computer).

Figure 2:
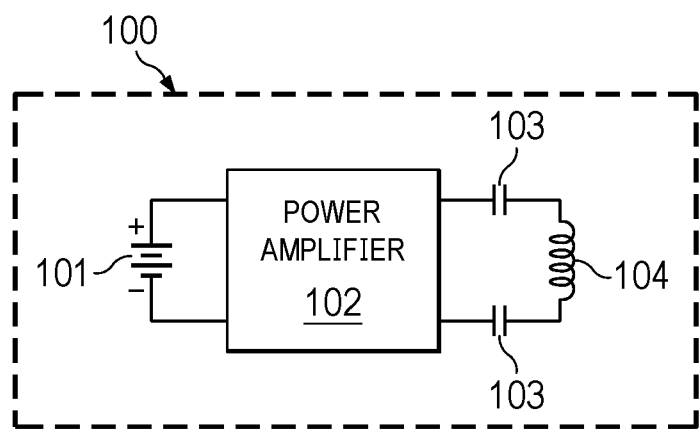
FIG. 2 is a schematic diagram of a portable battery pack with a built-in wireless power transmitter, according to an embodiment.
Figure 9A:
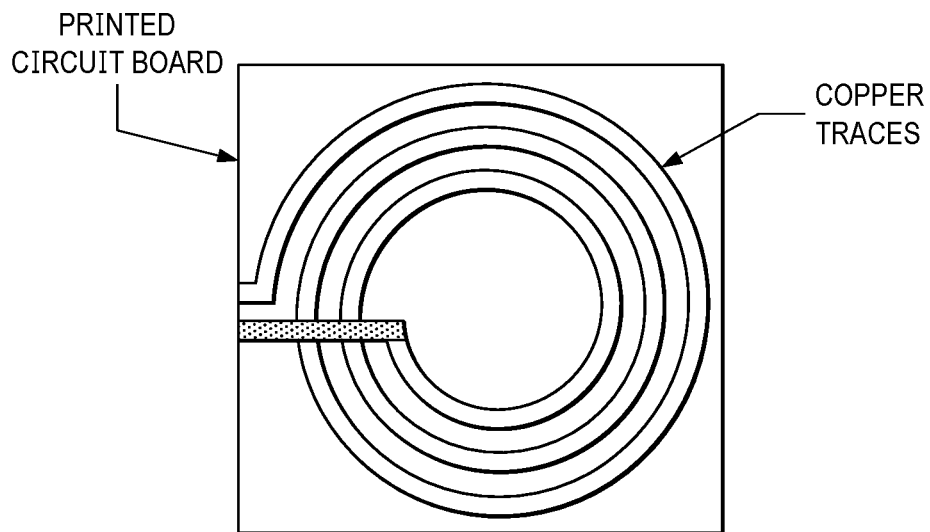
FIGS. 9A-9B are top and side views of a planar coil disposed on a PCB, according to an embodiment.
Figure 9B:
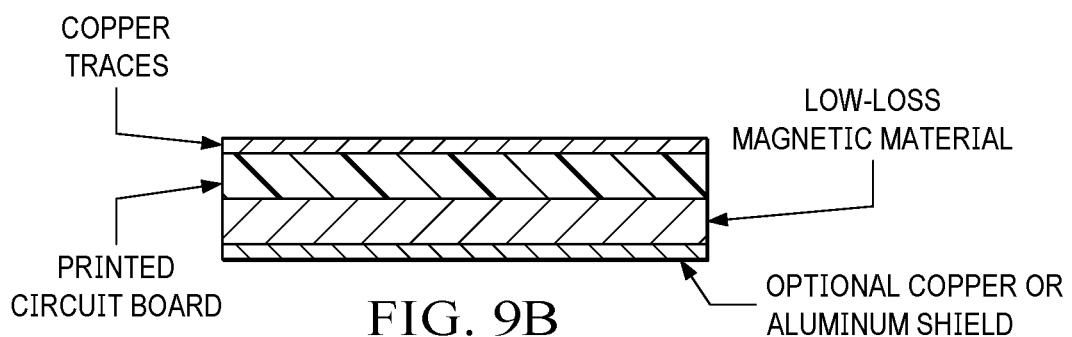

FIG. 2 is a schematic diagram of the portable battery pack 100 with a built-in wireless power transmitter, according to an embodiment. Portable battery pack 100 includes a printed circuit board (PCB) (not shown) for mounting electronic components, such battery cells 101, power amplifier 102, transmitter resonant capacitors 103 and transmitter coil 104. In an embodiment, power amplifier 102 feeds power into transmitter coil 104. Transmitter resonant capacitors 103 and transmitter coil 104 are used to wirelessly power portable electronic device 100 using the principle of resonant inductive coupling. In an embodiment, transmitter coil 104 is a planar copper winding formed as a spiral on a plane surface of the PCB, as shown in FIGS. 9A-9B. In an alternative embodiment, a single layer solenoid is used for the transmitter coil 104. Other coil shapes or types may be used, such as a wave-wound litz wire with appropriate insulation between strands (e.g., spacers, low permittivity or low loss materials to minimize dielectric losses). In an embodiment, there can be more than one PCB stacked in either portable battery pack 100 or portable electronic device 110 to increase the usable circuit area.

Figure 3:
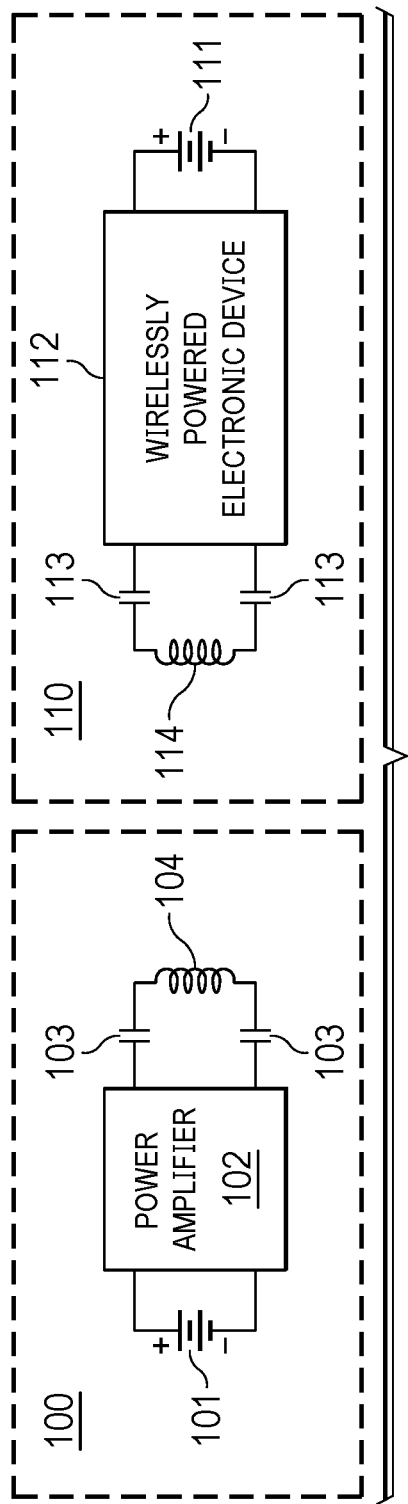
FIG. 3 is a schematic diagram of a portable battery pack with a built-in wireless power transmitter feeding power to a portable electronic device, according to an embodiment.

FIG. 3 is a schematic diagram of a portable battery pack with a built-in wireless power transmitter feeding power to a portable electronic device, according to an embodiment. In a mated configuration, transmitter coil 104 of portable battery pack 100 is excited by power amplifier, causing a quasi-static magnetic field which is coupled to receiver coil 114 of portable electronic device 110 to form a loosely-coupled transformer. Transmitter resonant capacitors 103 and receiver resonant capacitors 113 have capacitive values that allow resonant inductive coupling to improve power transfer. Also shown is an optional portable electronic device battery 111 (e.g., a rechargeable battery) that powers portable electronic device 110 when not receiving power from portable battery pack 100. In an embodiment, the dimensions of transmitter coil 104 and receiver coil 114 are equal or nearly equal, and the separation distance is less than about one fourth of the coil dimension. This allows the power efficiency to exceed 70%.

Figure 4:
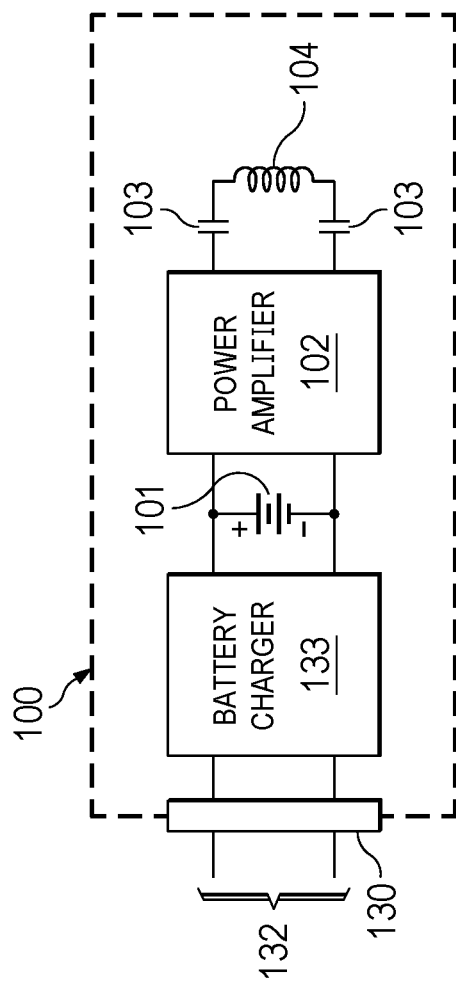
FIG. 4 is a schematic diagram of a portable battery pack with a built-in wireless power transmitter and a connector for charging the portable battery pack, according to an embodiment.

FIG. 4 is a schematic diagram of a portable battery pack 100 with a built-in wireless power transmitter and a connector 130 for charging the portable battery pack 100, according to an embodiment. In this embodiment, connector 130 with metal contacts is coupled to battery charger 133, which is configured to charge battery cells 101 using a standard wall outlet (120V). In an embodiment, battery charger 133 may have a rectifier circuit, temperature or voltage sensing circuits and a microprocessor controller to safely adjust the charging current and voltage, determine the state of charge, and cut off at the end of charge.

Figure 5:
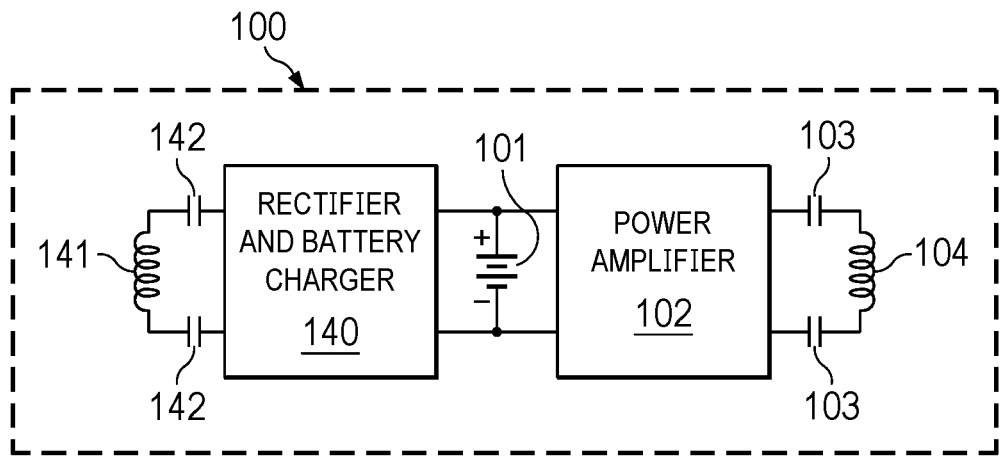
FIG. 5 is a schematic diagram of a portable battery pack with a built-in wireless power transmitter and a second coil for wirelessly charging the portable battery pack, according to an embodiment.

FIG. 5 is a schematic diagram of portable battery pack 100 with a built-in wireless power transmitter and second receiver coil 141 for wirelessly charging portable battery pack 100, according to an embodiment. In this configuration, portable battery pack 100 can be wirelessly charged by, for example, a charge mat. Receiver resonant capacitors 142 ensure maximum power transfer using resonant inductive coupling. In an embodiment, second receiver coil 141 can be used as an antenna for wireless communication when not being used for wireless charging. For example, a switching means can be used that switches the terminals of second receiver coil 144 from rectifier and battery charger 140 to a wireless transceiver (e.g., Bluetooth, NFC, RFID) when operating in a wireless communication mode.

Figure 6:
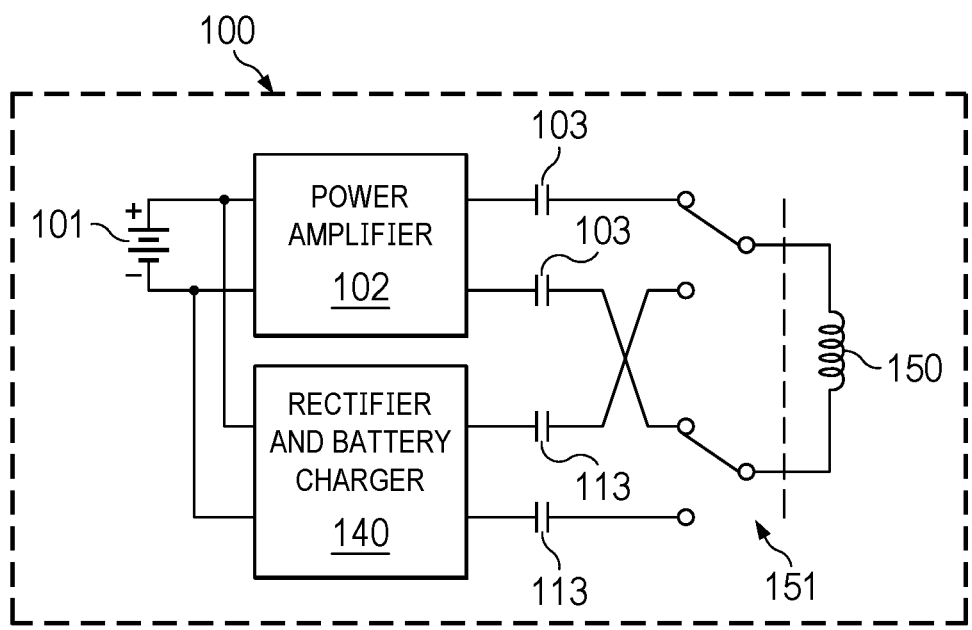
FIG. 6 is a schematic diagram of a portable battery pack with a single coil for powering a portable electronic device and for charging the portable battery pack, according to an embodiment.

FIG. 6 is a schematic diagram of portable battery pack 100 with single coil 150 for powering portable electronic device 110 and for charging portable battery pack 100, according to an embodiment. In this embodiment, switching means 151 is used to connect single coil 150 to power amplifier 102 in an operating mode, or connect single coil 150 to rectifier and battery charger 140 in a charging mode. With the use of single coil 150 for both the charging mode and the operating mode of portable battery pack 100, switching means 151 is used to connect coil 150 to either power amplifier 102 or rectifier and battery charger 140. Switching means 151 shown is a double-pole/double-throw relay. Other switching means are possible, such as solid state switches. Switching means 151 has both low parasitic capacitance between output terminals to achieve isolation in an off state, and low contact resistance to pass a signal in an on state.

Figure 7:
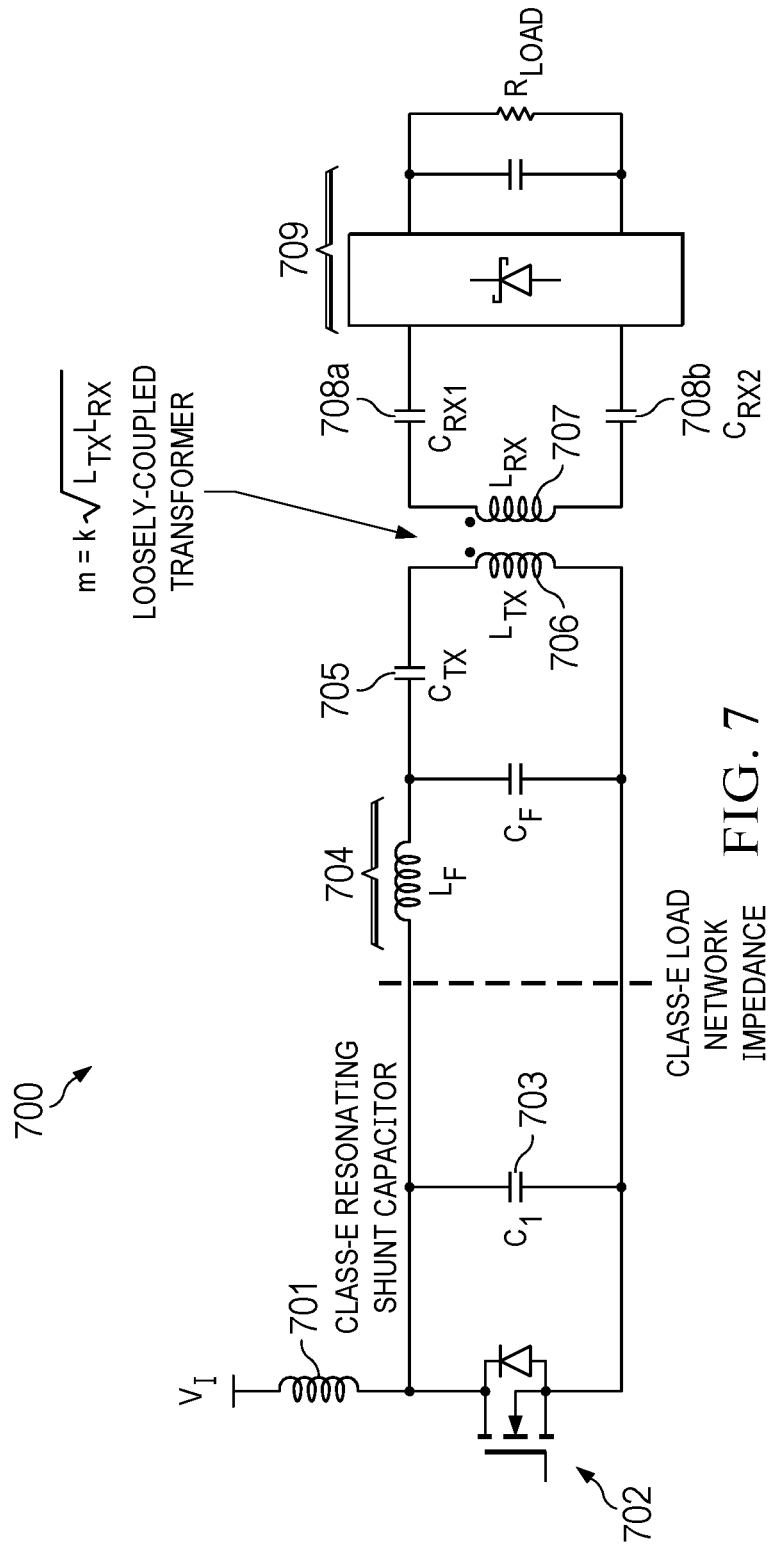
FIG. 7 is a schematic diagram of a single-ended Class E power amplifier for wireless power transfer, according to an embodiment.

FIG. 7 is a schematic diagram of a single-ended Class E power amplifier 700 for wireless power transfer, according to an embodiment. Power amplifier 700 includes DC feed inductor 701, MOSFET switch 702, resonating shunt capacitor 703 (C1), impedance match filter 704 ($L_F$ and $C_F$), transmitter resonant capacitor 705 ($C_{TX}$), transmitter coil 706 ($L_{TX}$), receiver coil 707 ($L_{RX}$), receiver resonant capacitors 708a ($C_{RX1}$) and 708b ($C_{RX2}$), rectifier and filter 709 (e.g., a full-wave (full diode) rectifier coupled in parallel with a filter capacitor for reducing ripple). Transmitter coil 706 and receiver coil 707 form a loosely-coupled transformer.

Figure 8:
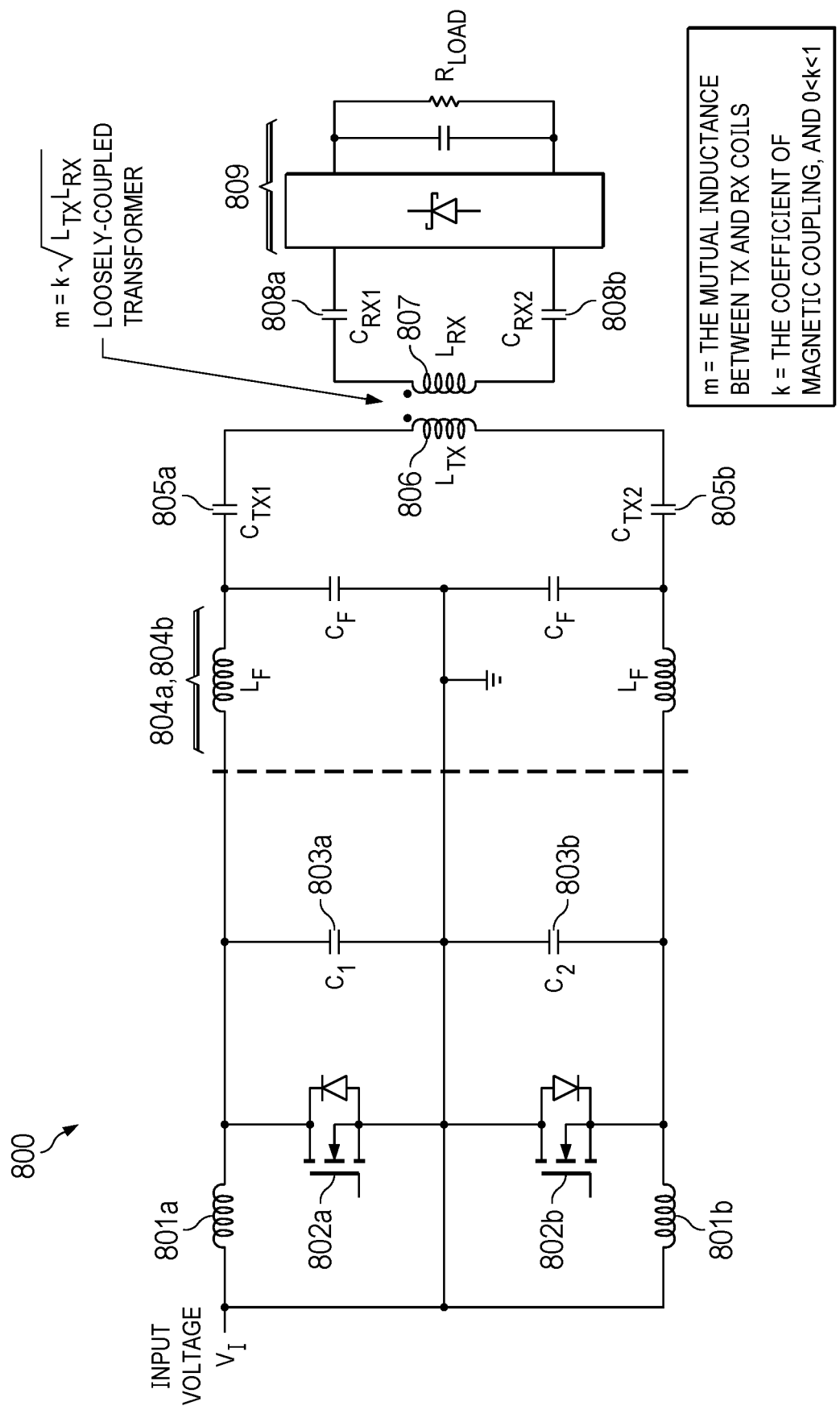
FIG. 8 is a schematic diagram of a push-pull Class-E converter for wireless power transfer, according to an embodiment.

FIG. 8 is a schematic diagram of push-pull Class-E converter 800 for wireless power transfer, according to an embodiment. Converter 800 includes DC feed inductors 801a, 801b, MOSFET switches 802a, 802b, resonating shunt capacitors 803a (C1) and 803b (C2), impedance match filters 804a, 804b (which include inductors $L_F$ and capacitors $C_F$), transmitter resonant capacitors 805a ($C_{TX1}$) and 805b ($C_{TX2}$), transmitter coil 806 ($L_{TX}$), receiver coil 807 ($L_{RX}$), resonant capacitors 808a ($C_{RX1}$) and 808b ($C_{RX2}$) and rectifier and filter 809. Transmitter coil 806 and receiver coil 807 form a loosely-coupled transformer.

In the embodiments shown in FIGS. 7 and 8, the Z-match filters include inductor $L_F$ and capacitor $C_F$ and are used for impedance matching. In another embodiment the L-C filter is omitted, and in place of the $L_F$ filter there is a short circuit and in place of $C_F$ there is an open circuit. Although this embodiment uses a Class-E power amplifier, a Class-D or other power amplifier topology can also be employed. The inductor $L_F$ and the capacitor $C_F$ form a two-port network that constitutes a low-pass filter, and can be employed for impedance matching in the power amplifier 102.

In an embodiment, the coils are constructed using spiral wound traces (e.g., copper traces) on a PCB, and a shield of ferrite material is used behind the PCB to shape the magnetic field. The loss tangent of the ferrite material should be low at the chosen frequency of operation. In another embodiment, a thin sheet of metal, e.g., copper or aluminum, is placed behind the ferrite shield to further attenuate the magnetic field behind the coil/shield assembly.

In an embodiment, portable battery pack 100 includes additional circuitry needed to comply with at least one of The Alliance for Wireless Power (A4WP), the Power Matters Alliance (PMA) and the Wireless Power Consortium (WPC or "Qi") standards.

FIGS. 9A-9B are top and side views of a planar coil disposed on a PCB, according to an embodiment. In this example embodiment, copper traces are spiral wound on PCB. The copper traces are disposed on a low-loss magnetic material which is optionally disposed on a copper or aluminum shield. Any desired number of turns can be used depending on the application and operating constraints.

What is claimed is:
1. A wireless power transfer system, comprising:
a portable battery pack including:
a first housing having a first mating surface;
a first permanent magnet disposed on the first mating surface for coupling with a second permanent magnet on a portable electronic device;
first battery cells secured within the first housing;
a first printed circuit board (PCB) secured within the first housing, the first PCB including:
a power amplifier coupled to the first battery cells;
a rectifier and battery charger coupled to the first battery cells;
a connector with metal contacts coupled to the rectifier and battery charger, the connector configured for connecting to an input power source; and
a transmitter coil coupled to the power amplifier through transmitter resonant capacitors;
a portable electronic device including:
a second housing having a second mating surface;
the permanent magnet disposed on the second mating surface for coupling with the first permanent magnet disposed on the first mating surface of the portable battery pack;
a second battery included in the second housing; and
a receiver coil included in the second housing and coupled to the second battery, wherein the first mating surface and the second mating surface have the same dimensions, such that there is no overhanging portions of the first housing or the second housing when the portable battery pack and the portable electronic device are joined in a mated configuration by the first and second permanent magnets.

2. The wireless power transfer system of claim 1, further comprising:
   a second PCB included in the second housing; and
   a camera attached to the second PCB, the camera having a lens aligned with an opening in the second housing.

3. The wireless power transfer system of claim 1, wherein the transmitter coil is constructed using spiral wound traces on the first PCB, and a shield of ferrite material is used behind the first PCB to shape a magnetic field emitted by the transmitter coil.

4. The wireless power transfer system of claim 1, wherein at least one of the portable battery pack or the portable electronic device provides haptic feedback indicating successful mating or connection to the input power source.

5. The wireless power transfer system of claim 4, wherein the haptic feedback is provided by a linear actuator.

6. The wireless power transfer system of claim 1, wherein in the mated configuration, the transmitter coil of the portable battery pack is excited by the power amplifier of the portable battery pack, causing a quasi-static magnetic field coupled to the receiver coil of the portable electronic device to form a loosely-coupled transformer.

\* \* \* \* \*